(12) United States Patent
Hopkins et al.

(10) Patent No.: US 12,439,626 B2
(45) Date of Patent: Oct. 7, 2025

(54) SELF-ALIGNED MEMORY ARCHITECTURE COMPRISING A MEMORY ARRAY ASSOCIATED WITH PILLARS AND POLYSILICON MATERIAL

(71) Applicant: Micron Technology, Inc., Boise, ID (US)

(72) Inventors: John Hopkins, Meridian, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 554 days.

(21) Appl. No.: 17/804,997

(22) Filed: Jun. 1, 2022

(65) Prior Publication Data
US 2023/0395704 A1    Dec. 7, 2023

(51) Int. Cl.
*H10D 30/01*  (2025.01)
*H10B 43/35*  (2023.01)
*H10D 30/69*  (2025.01)

(52) U.S. Cl.
CPC ......... *H10D 30/0413* (2025.01); *H10B 43/35* (2023.02); *H10D 30/69* (2025.01)

(58) Field of Classification Search
CPC ........ H10B 43/35; H10B 43/27; H10B 43/10; H10D 30/0413; H10D 30/69; H10D 64/037
USPC ....................................................... 257/213
See application file for complete search history.

(56) References Cited

U.S. PATENT DOCUMENTS

| | | | | |
|---|---|---|---|---|
| 2013/0161717 | A1* | 6/2013 | Choi | H10B 43/27 |
| | | | | 257/E21.409 |
| 2014/0138687 | A1* | 5/2014 | Lee | H10D 30/751 |
| | | | | 438/269 |
| 2014/0167131 | A1* | 6/2014 | Lu | H10D 30/0411 |
| | | | | 438/257 |
| 2016/0172368 | A1* | 6/2016 | Pang | H10B 41/35 |
| | | | | 438/269 |
| 2017/0213843 | A1* | 7/2017 | Choi | H10D 64/511 |
| 2019/0057975 | A1* | 2/2019 | Kim | H10B 43/35 |
| 2019/0074291 | A1* | 3/2019 | Lu | H10D 64/037 |
| 2019/0287988 | A1* | 9/2019 | Takekida | H10D 62/292 |
| 2020/0411761 | A1* | 12/2020 | Gotti | G11C 13/003 |
| 2021/0043685 | A1* | 2/2021 | Redaelli | H10N 70/231 |
| 2021/0234097 | A1* | 7/2021 | Gotti | H10N 70/063 |
| 2021/0312978 | A1* | 10/2021 | Economy | H10N 70/231 |

* cited by examiner

Primary Examiner — Didarul A Mazumder
(74) Attorney, Agent, or Firm — Holland & Hart LLP

(57) ABSTRACT

Methods, systems, and devices for self-aligned etching techniques for memory formation are described. A memory device may include a stack of alternating materials and a pillar extending through the stack of alternating materials, where the stack of alternating materials and the pillar may form a set of multiple memory cells. A polysilicon material may be formed above the pillar, where the polysilicon material may be associated with a selector device for the memory cells. A masking material may be formed above the polysilicon material and the stack of alternating materials, where the masking material may be aligned with the polysilicon material and may have a width that is greater than a width of the polysilicon material and the pillar. The masking material may prevent the polysilicon material, the pillar, and a portion of the stack of alternating materials beneath the masking material from being removed during an etching operation.

7 Claims, 7 Drawing Sheets

SELF-ALIGNED MEMORY ARCHITECTURE COMPRISING A MEMORY ARRAY ASSOCIATED WITH PILLARS AND POLYSILICON MATERIAL

FIELD OF TECHNOLOGY

The following relates to one or more systems for memory, including self-aligned etching techniques for memory formation.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

A memory device may include a memory array with a stack of alternating materials (e.g., a stack of layers associated with memory cells and their respective access lines) formed above a substrate, and pillars (e.g., one or more materials associated with the memory cells) extending away from the substrate through the stack of alternating materials. In some examples, the memory array may include a respective polysilicon material above and coupled with each of the pillars, which polysilicon material may be associated with a selector device for the associated pillar. During fabrication of the memory device, one or more markings may identify (e.g., for a photoalignment operation) one or more portions of the memory array (e.g., the polysilicon material) not subjected to an etching operation. However, in some implementations, the memory device may experience misalignment (e.g., due to mechanical stresses and bending, as a result of manufacturing operations) of the memory array prior to the etching operation. Misalignment of the memory array relative to the one or more markings may cause one or more portions of the memory array (e.g., such as those identified by the marking(s), at least a portion of the polysilicon material) to be unintentionally removed during the etching operation, which may cause damage and reduced functionality to components in the portions of the memory array that are unintentionally etched.

According to the techniques described herein, a memory device may be formed using self-aligned etching techniques, which may prevent removal of the one or more portions of the memory array during the etching operation (e.g., prevent unintentional removal). For example, the memory device may include a masking material (e.g., above the polysilicon material on the pillars), which may prevent etching to the one or more portions of the memory array below the masking material. The masking material may be selectively deposited onto the polysilicon material such that the masking material may extend out further than (e.g., covering) the polysilicon material, and may further cover other portions of the memory array below the masking material. Thus, during the etching operation, the masking material may prevent at least these portions of the memory array (e.g., below the masking material) from being etched. For example, when there is misalignment in the memory array, the masking material may prevent the misalignment from causing the etching operation to unintentionally remove the portions of the memory array not designated for etching. Implementing such self-aligned etching techniques may prevent damage and reduced functionality to components during etching.

Figure 1:
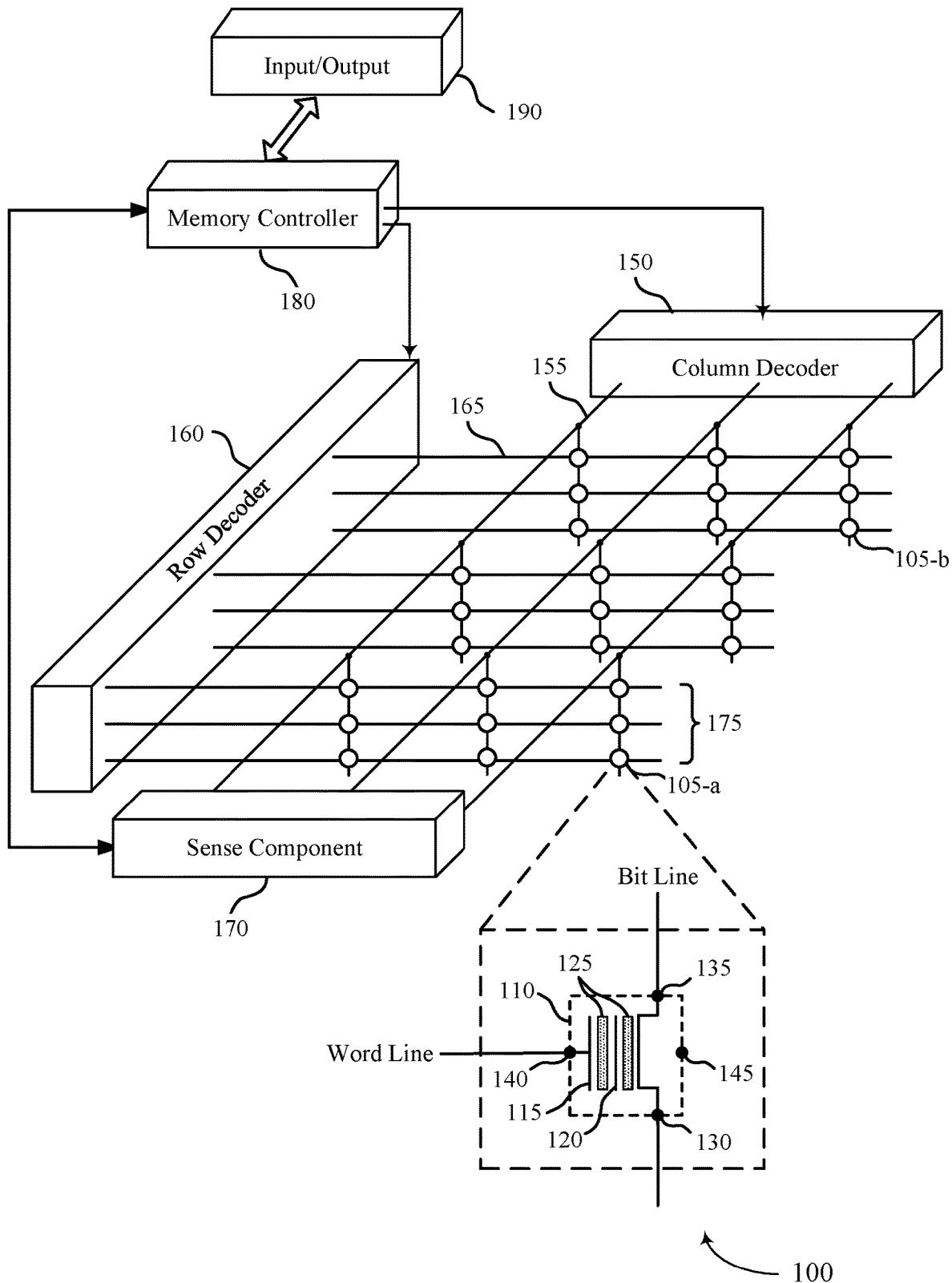
FIG. 1 illustrates an example of a system that supports self-aligned etching techniques for memory formation in accordance with examples as disclosed herein.

Features of the disclosure are initially described in the context of a memory device with reference to FIG. 1. Features of the disclosure are described in the context of processing steps and memory architectures with reference to FIGS. 2A through 3. These and other features of the disclosure are further illustrated by and described in the context of flowcharts that relate to self-aligned etching techniques for memory formation with reference to FIGS. 4 and 5.

FIG. 1 illustrates an example of a memory device 100 that supports self-aligned etching techniques for memory formation in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells 105, such as memory cell 105-*a* and memory cell 105-*b*. In some examples, a memory cell 105 may be a NAND memory cell, such as in the blow-up diagram of memory cell 105-*a*. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-*a* that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-*a* is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., a channel between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105.

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. Upon accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

The memory device 100 may include a memory array with a stack of alternating materials (e.g., a stack of layers associated with memory cells 105 and their respective access lines) formed above a substrate, and pillars (e.g., one or more materials associated with accessing the memory cells) extending away from the substrate through the stack of alternating materials. In some examples, the memory array may include a respective polysilicon material above and coupled with each of the pillars, which polysilicon material may be associated with a selector device for the associated pillar. During fabrication of the memory device, the memory device may include a masking material (e.g., above the polysilicon material on the pillars), which may prevent etching to the one or more portions of the memory array below the masking material. The masking material may be selectively deposited onto the polysilicon material such that the masking material may extend out further than (e.g., covering) the polysilicon material, and may further cover other portions of the memory array below the masking material. Thus, during the etching operation, the masking material may prevent at least these portions of the memory array (e.g., below the masking material) from being etched. For example, when there is misalignment in the memory array, the masking material may prevent the misalignment from causing the etching operation to unintentionally remove the portions of the memory array not designated for etching.

FIGS. 2A through 2F illustrate examples of processing steps 200 that support self-aligned etching techniques for memory formation in accordance with examples as disclosed herein. The processing steps 200 may illustrate aspects of a sequence of manufacturing operations for fabricating aspects of a memory device 100 described with reference to FIG. 1. For illustrative purposes, aspects of the memory device may be described with reference to an x-direction, a y-direction (e.g., into the page), and/or a z-direction of the illustrated coordinate system. For example, the processing steps 200 illustrate various cross-sectional views of the memory device in an xz-plane through the memory device. In some examples, the z-direction may be illustrative of a direction (e.g., a vertical direction, a layer direction) orthogonal to a surface of a substrate (e.g., a surface in an xy-plane, a surface upon or over which other materials may be deposited), and each of the related regions, illustrated by their respective cross section in the xz-plane, may extend for some distance along the y-direction (e.g., above or on the substrate). Although the processing steps 200 illustrate examples of relative dimensions and quantities of various features, aspects of the memory device may be implemented with other relative dimensions or quantities of such features in accordance with examples as disclosed herein.

Operations illustrated in and described with reference to FIGS. 2A through 2F may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

A memory device may implement a memory architecture (e.g., arrangements of memory components) configured to provide access to memory cells. For example, the memory device may include a stack of alternating materials 205 (e.g., a stack of layers associated with housing memory cells and their respective access lines) formed above the substrate. The memory device may also include pillars 210 (e.g., including one or more materials associated with the memory cells) extending away from the substrate through the stack of alternating materials 205. Some portions of the stack of alternating materials 205 and the pillars 210 may extend below (e.g., in the z-direction) what is illustrated in FIGS. 2A-2F, such that the illustrations of FIGS. 2A-2F may illustrate a top portion of the stack of materials 205 and the pillars 210.

In some implementations, an access voltage may be applied to a pillar 210 and an access line such that a memory cell corresponding to the pillar 210 and the access line may be accessed (e.g., for a read operation, write operation). In some examples, the memory array may include polysilicon material 215 (e.g., a polysilicon plug) deposited onto the pillars 210 (e.g., above the pillars 210), which may be associated with or coupled to a selector gate (e.g., a selector gate source or a selector gate drain). The polysilicon material 215 may be associated with markers for photoalignment of an etching operation (e.g., dry etching), where the polysilicon material 215 may be designated (e.g., by the markers) as a portion of the memory array not to etch. In some cases, the etching operation may be implemented to separate the memory cells of the memory array into subblocks. However, in some examples, the photoalignment operation may use manufacturing components relatively distant (e.g., hundreds or thousands of rows away, in the y-direction) from a portion of the polysilicon material 215 (e.g., a portion of the polysilicon material 215 as illustrated by the cross-sectional view). Some memory systems may be divided into blocks of memory cells. In some non-volatile memory devices, a block may be an example of a unit of memory that can be erased (where a page may be an example of a unit of memory that can be read and programmed). The subblocks described herein may be examples of divisions of a block of memory cells in the memory device.

In some implementations, the memory device may experience misalignment from block bending or die stress (e.g., in-die stress) of the memory array prior to the etching operation. The misalignment may result from mechanical stress and bending associated with a temperature applied during manufacturing (e.g., such as induced thermal stress), a change in grain size during manufacturing (e.g., which may induce mechanical stress), or an annealing procedure, among other factors. For example, the misalignment may result from a metallization operation performed on material layers (e.g., nitride layers) of the stack of alternating materials 205. In some cases, misalignment may cause the pillars 210 to be offset from the markers in the x-direction, where the markers may be located at a different y-location in the memory array. Because such deformation and misalignment may be unaccounted for during the photoalignment operation, the misalignment of the memory array and the markers may cause a portion of the polysilicon material 215 and/or pillars 210 to be unintentionally removed during the etching operation, causing damage, reduced functionality, or both, to associated components of the memory array (e.g., selector devices, memory cells).

The present disclosure provides techniques for the memory device to include a first material 230 (e.g., above the polysilicon material 215) and a masking material 235 (e.g., above the first material 230), where the masking material 235 may prevent etching the polysilicon material 215 and/or pillars 210 (e.g., and one or more other portions of the memory array) during the etching operation. The masking material 235 may be deposited such that the masking material 235 may extend out further than the pillars 210 and polysilicon material 215 in the x-direction, such that the masking material 235 may cover the pillars 210, the polysilicon material 215 and any portion of the memory array located below the masking material 235. Thus, during the etching operation, the masking material 235 may prevent the polysilicon material 215, the pillars 210, and the portion(s) of the memory array from being etched. Further, when there is misalignment in the memory array, the masking material 235 may prevent the misalignment from causing the etching operation to unintentionally remove a portion of the memory array not designated for etching (e.g., pillars 210 polysilicon material 215). The masking material 235 may not prevent the etching operation on a desired portion of the memory array, thereby supporting separation of the memory cells in the memory array into subblocks. Implementing such self-aligned etching techniques may thus prevent damage and/or reduced functionality resulting to components during etching.

Figure 2A:
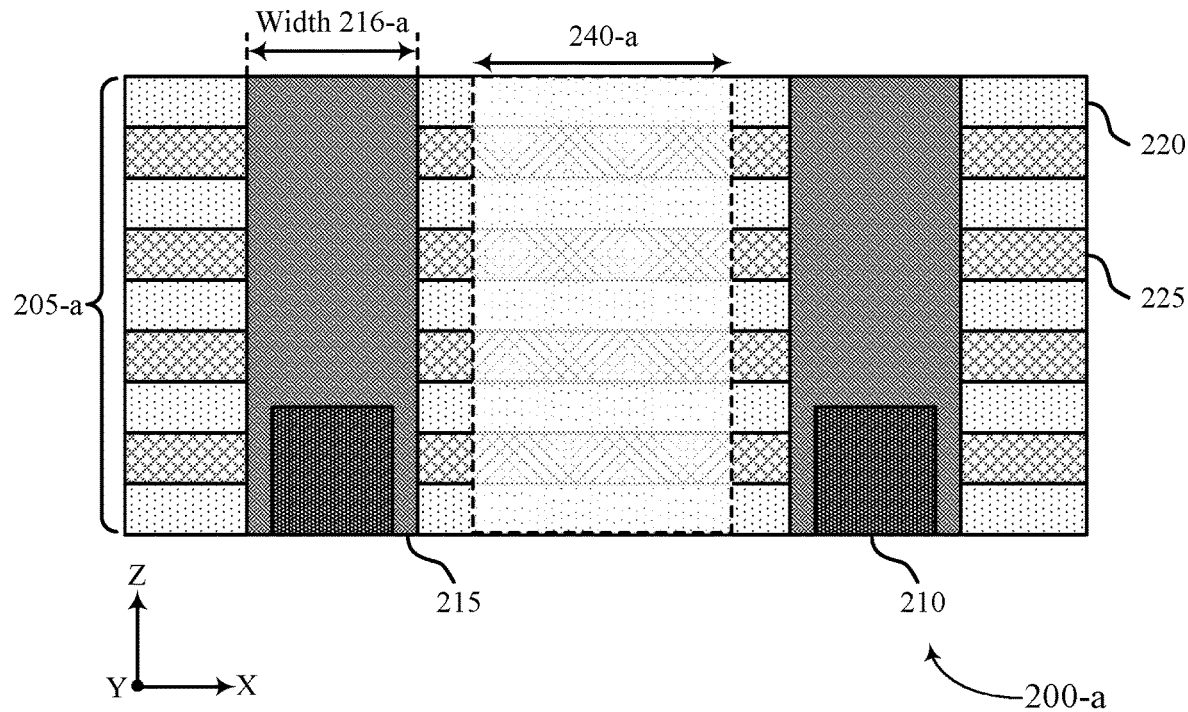
FIGS. 2A-2F illustrate examples of processing steps that support self-aligned etching techniques for memory formation in accordance with examples as disclosed herein.

FIG. 2A illustrates the memory array at a processing step 200-a. At the processing step 200-a, a stack of alternating materials 205-a may have been formed above the substrate. The stack of alternating materials 205-a may include alternating layers of an oxide material 220 (e.g., a dielectric material) and a nitride material 225 (e.g., a sacrificial material). Any quantity of layers may be deposited (e.g., formed), for example, based on a desired quantity of levels (e.g., decks) of the memory device. In some cases, the stack of alternating materials 205-a may be formed such that each material may be deposited coplanar on an xy-plane, and the layers may stack in the z-direction (e.g., may be formed one above another in the z-direction). Additionally, multiple pillars 210 may be formed above the substrate. The pillars 210 may extend in a different direction than (e.g., may be orthogonal to) materials of the stack of alternating materials 205 (e.g., may extend in the z-direction). The pillars 210 may include various materials such as channel material, tunnel material, charge trapping material, and one or more oxide materials. In combination with the stack of alternating materials 205 (e.g., once fabrication of the memory device is completed), each pillar 210 may be associated with a quantity of multiple memory cells (e.g., may form at least a part of each of the multiple memory cells).

At the processing step 200-a, a respective polysilicon material 215 may have been formed above each pillar 210. The polysilicon material 215 may be associated with a selector gate of a transistor for a source or a drain of a channel (e.g., coupled to the polysilicon material 215) associated with the quantity of memory cells corresponding to the respective pillar 210. The polysilicon material 215 may have a first width 216-a, which may be a same width, or a similar width, as a width of the corresponding pillar 210. Although not occurring at or prior to processing step 200-a, for illustrative purposes a first portion of the stack of alternating materials 205-a to be removed during the etching operation is shown. The first portion of the stack of alternating materials 205-a may be the future location of a trench 240-a, where the trench 240-a may be configured to separate the memory cells of the memory array into subblocks.

Figure 2B:
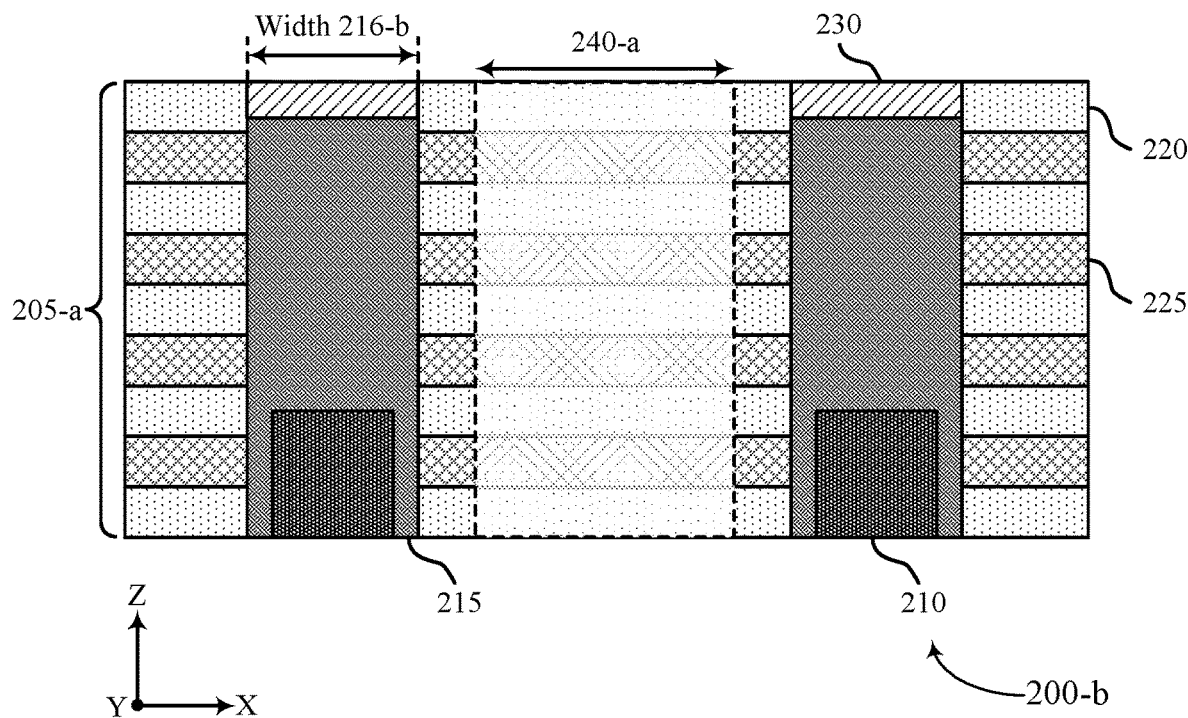

FIG. 2B illustrates the memory array after a processing step 200-*b* has been completed, where the processing step 200-*b* may include one or more steps or actions. In the processing step 200-*b*, a portion of the polysilicon material 215 may be removed to form a recess in the polysilicon material 215 (e.g., a surface recessed from a top of the stack of materials 205-*a*). The portion of the polysilicon material 215 may have a width 216-*b* equivalent, or relatively close, to the first width 216-*a* of the polysilicon material 215. The removed portion of the polysilicon material 215 may be opposite the substrate (e.g., in the z-direction) and may expose a surface (e.g., top surface) of the polysilicon material 215 below the top of the memory array (e.g., in the z-direction). In some examples, the polysilicon material 215 may be selectively etched (e.g., wet etched) for removal (e.g., selective removal) of the portion of the polysilicon material 215.

Additionally, in the processing step 200-*b*, a first material 230 may be deposited (e.g., formed) into the recess of the polysilicon material 215. The first material 230 may be a titanium nitride (TiN) material in some examples, although other materials (e.g., including other nitride materials) may be used. In some implementations, the first material 230 may be formed by depositing titanium into the recess and siliciding the titanium to form titanium silicide, where the titanium silicide may be nitridized to form titanium nitride. The first material 230 may have a width that is the same as, or relatively close to, the width 216-*b* and may be deposited in the z-direction. The first material 230 may be deposited (e.g., formed) into the recess such that the first material 230 may extend above (e.g., in the z-direction) a top surface of the stack of alternating materials 205, or may be coplanar (e.g., relatively or largely coplanar) to the top surface of the stack of alternating materials 205. In some cases where the first material 230 extends above the top surface of the stack of alternating materials 205, the first material 230 may be planarized such that a portion of the first material 230 extending above the top surface of the stack of alternating materials 205 may be removed and a resulting top surface of the first material 230 may be coplanar (e.g., relatively or largely coplanar) to the top surface of the stack of alternating materials 205.

Figure 2C:
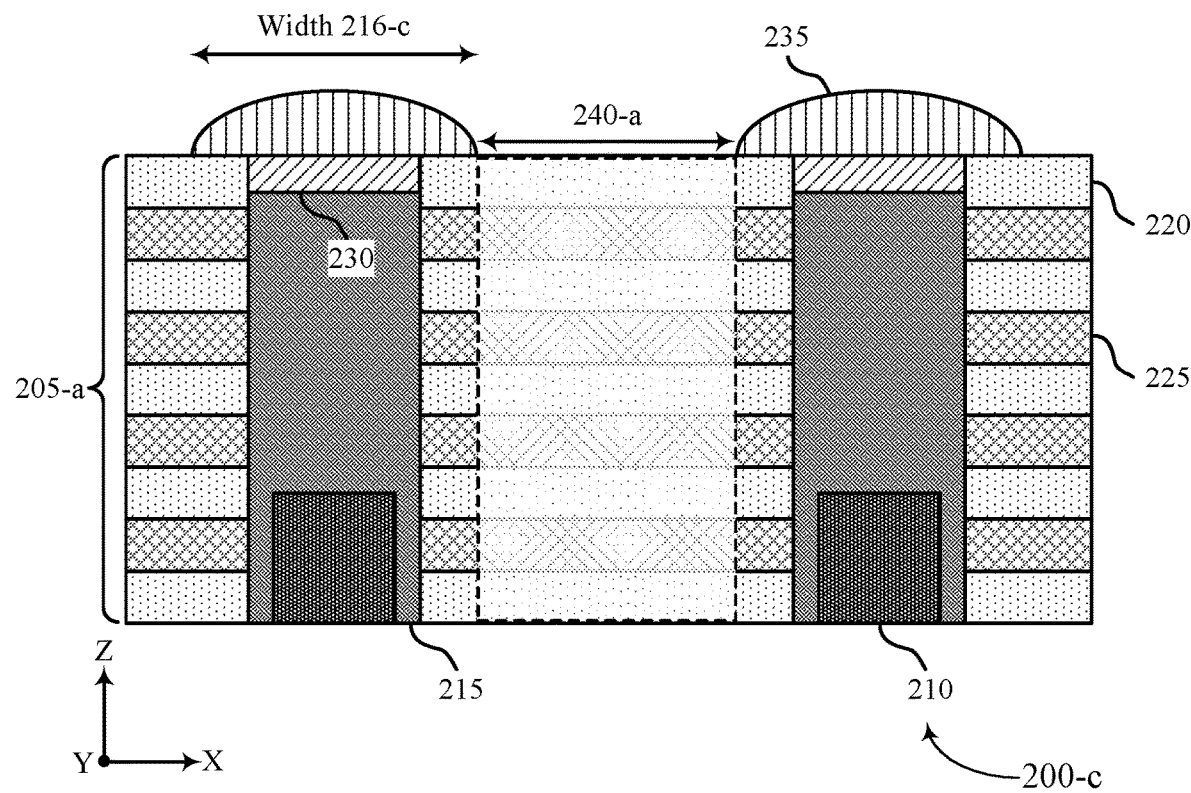

FIG. 2C illustrates the memory array after a processing step 200-*c* has been completed, where the processing step 200-*c* may include one or more steps or actions. In the processing step 200-*c*, a masking material 235 may be deposited (e.g., selectively deposited or formed) onto, or above, the first material 230. The masking material 235 may be a material associated with masking (e.g., preventing) an etching operation such as a dry etch. The material chosen for the masking material 235 may be based on the material chosen for the first material 230, or vice versa. For example, the masking material 235 may be a tantalum oxide material (e.g., $Ta_2O_5$) when the first material 230 is a titanium nitride material. In other cases, the masking material 235 may be a different material than tantalum oxide and the first material 230 may be chosen based on the different material chosen for the masking material 235 (e.g., the first material 230 and the masking material 235 may be chosen together, such as for complementary properties). In some cases, the masking material 235 may function, or be referred to, as a hardmask.

The masking material 235 may be selectively deposited (e.g., formed) above (e.g., above in the z-direction) the first material 230, above the polysilicon material 215 and the pillar 210, such that the masking material 235 may be concentrically aligned with the first material 230, the polysilicon material 215, and the pillar 210. In some cases, the masking material 235 may be deposited onto the first material 230 based on a chemical interaction between the masking material 235 and the first material 230. Such an interaction may support an amount and location of masking material 235 to be selectively controlled during deposition. For example, the masking material 235 may selectively bond to the first material 230 and grow on the first material 230 and on the masking material 235 itself (e.g., selectively or preferentially). The growth of the masking material 235 may extend above (e.g., along the z-direction) the top surface of the first material 230, the stack of alternating materials 205-*a*, the polysilicon material 215, and the pillar 210. The growth of the masking material 235 on other materials (e.g., such as the first material 230) may ensure that the hardmask is aligned with the pillar 210 and the polysilicon material 215 even in the presence of deformations of the entire structure.

Additionally, the masking material 235 may be selectively deposited (e.g., formed) to have a second width 216-*c* (e.g., along the x-direction) greater than the first width 216-*a* or the width 216-*b*, as described with reference to FIGS. 2A and 2B. The width of the masking material 235 may be based on (e.g., determined by) the manufacturing operations used to deposit and grow the masking material 235. The masking material 235 may be deposited to have the second width 216-*c* to prevent etching at least a second portion of the memory array during the etching operation, where the second portion of the memory array may be located below (e.g., along the z-direction) the masking material 235. For example, the masking material 235 may prevent etching a portion of the stack of alternating materials 205-*a*, a portion of the polysilicon material 215, or a portion of the pillar 210, among other examples. The masking material 235 covering at least the second portion of the memory array (e.g., among other portions of the masking material 235), and portions of the memory array below the masking material 235, may not be etched (e.g., removed) during the etching operation as a result of one or more properties of the masking material 235. In some cases, the width (e.g., second width 216-*c*) of the masking material 235 may be determined by a desired width of the trench 240-*a* (e.g., because the masking material 235 may not prevent the trench 240-*a* from being etched). In some other cases, the width of the trench 240-*a* may be determine by a desired width of the masking material 235. Although described as happening before a metallization operation herein, in some cases, the masking material 235 may be deposited after the metallization operation is performed on the stack of alternating materials 205-*a*.

Figure 2D:
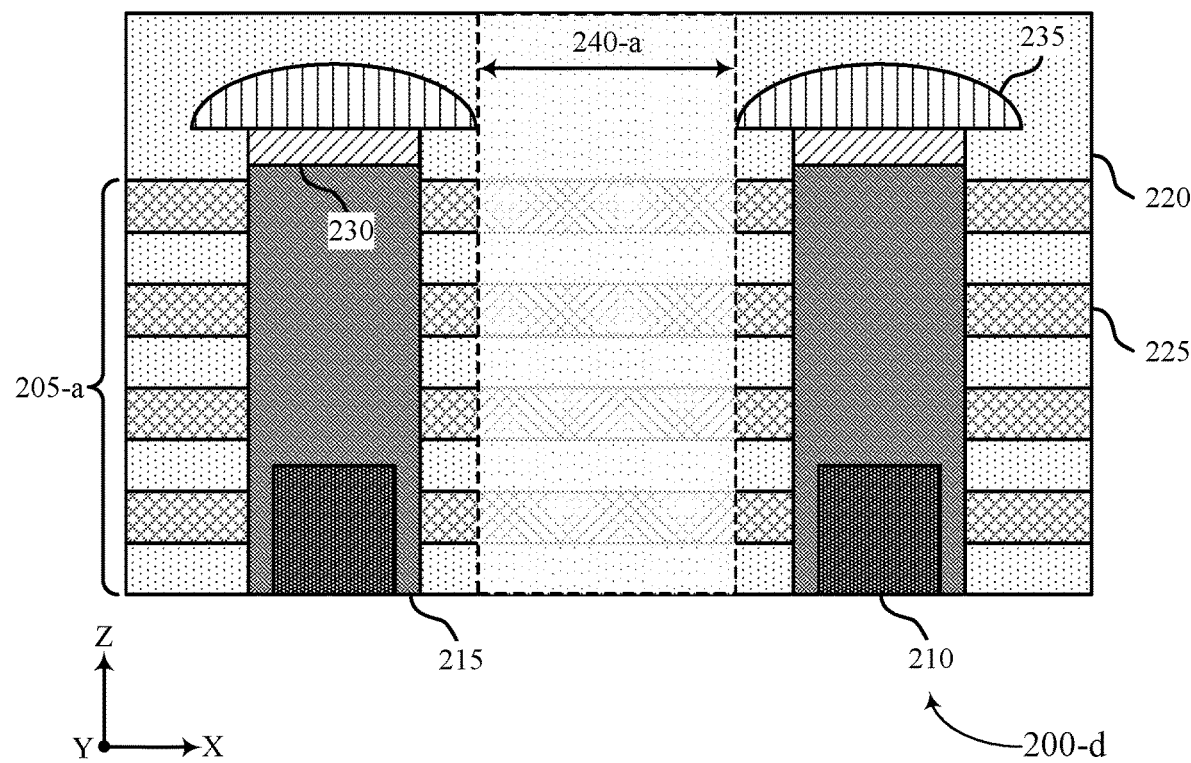

FIG. 2D illustrates the memory array after a processing step 200-*d* has been completed, where the processing step 200-*d* may include one or more steps or actions. In the processing step 200-*d*, an oxide material 220 may be deposited (e.g., formed) above the masking material 235 and the stack of alternating materials 205-*a* (e.g., above and/or in contact with an oxide material 220 of the stack of alternating materials 205-*a*). The oxide material 220 may be a same oxide material or a different oxide material as the oxide material 220 included in the stack of alternating materials 205-*a*. The oxide material 220 may be deposited (e.g., formed) to be coincident to (e.g., on, on top of) the stack of alternating materials 205-*a* and the masking material 235. In some cases, the oxide material 220 may be planarized after deposition. In some cases, the processing step 200-*d* may occur after (e.g., in response to) the processing step 200-*c*. However, in some other cases, the processing step 200-*d* may occur after (e.g., in response to) the processing step 200-*e*.

Figure 2E:
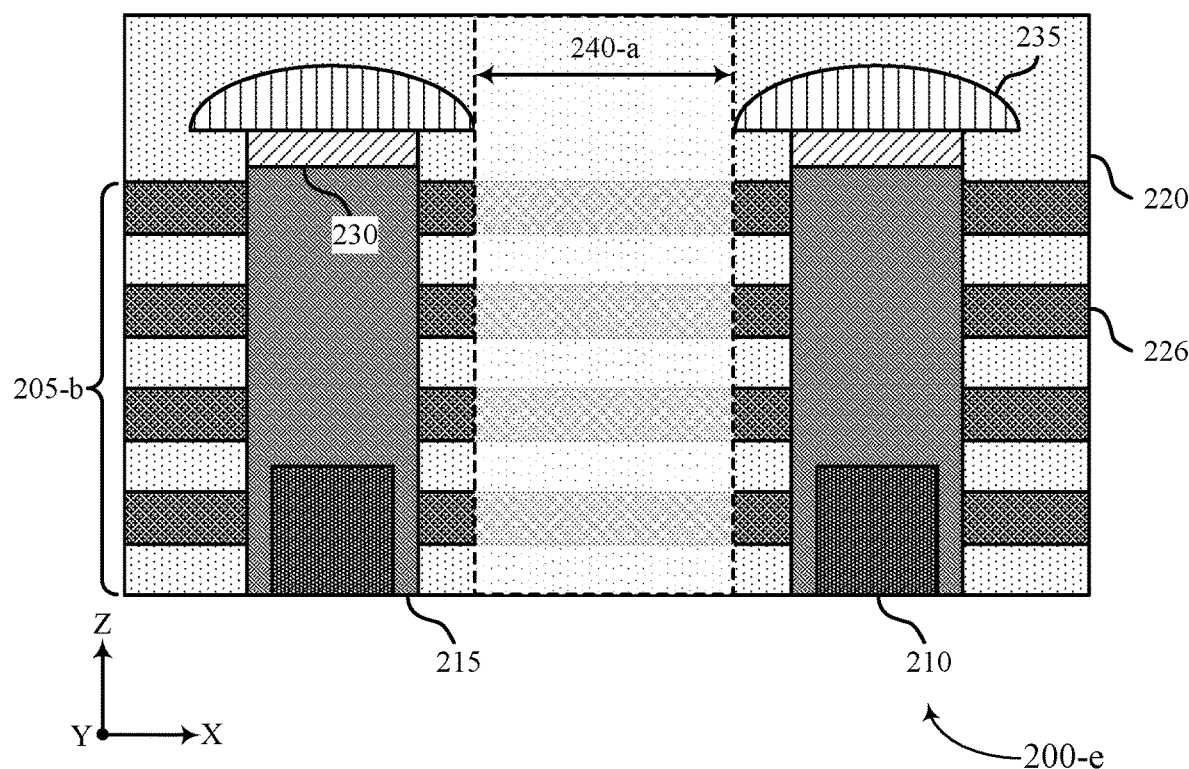

FIG. 2E illustrates the memory array after a processing step 200-e has been completed, where the processing step 200-e may include one or more steps or actions. In the processing step 200-e, a metallization operation, or metallization operations, may occur. The metallization operation(s) may be performed using one or more methods, techniques, or steps, each of which may include one or more corresponding processing steps. For example, the metallization operation may include removing one or more layers of the nitride material 225 (e.g., sacrificial material) and replacing the one or more layers of the nitride material 225 with a conductive material 226 (e.g., a metal such as tungsten or molybdenum).

In some cases, prior to the processing step 200-e, the one or more layers of the nitride material 225 may function as a sacrificial material (e.g., a material to be removed and replaced). In some cases, the conductive material 226 may be used in the metallization operation to form a quantity of memory cells, together with the pillars 210. In some cases, the metallization operation may be performed by vaporizing the nitride material 225 to remove the nitride material 225 from the stack of alternating materials 205-a. The stack of alternating materials 205-a may still include the oxide material 220, but may experience bending due to instability without the layers of the nitride material 225 (e.g., which may be a cause of deformation and/or misalignment as described herein). The conductive material 226 may be deposited into the space previously occupied by the nitride material 225 (e.g., to form a stack of alternating materials 205-b) by means of chemical vapor deposition (CVD) or plasma enhanced chemical vapor deposition (PECVD), among other examples of deposition or forming processes. In some cases, the metallization operation may be associated with causing bending, mechanical stress, thermal stress, or one or more other factors contributing to deformation and/or misalignment of the memory array.

Figure 2F:
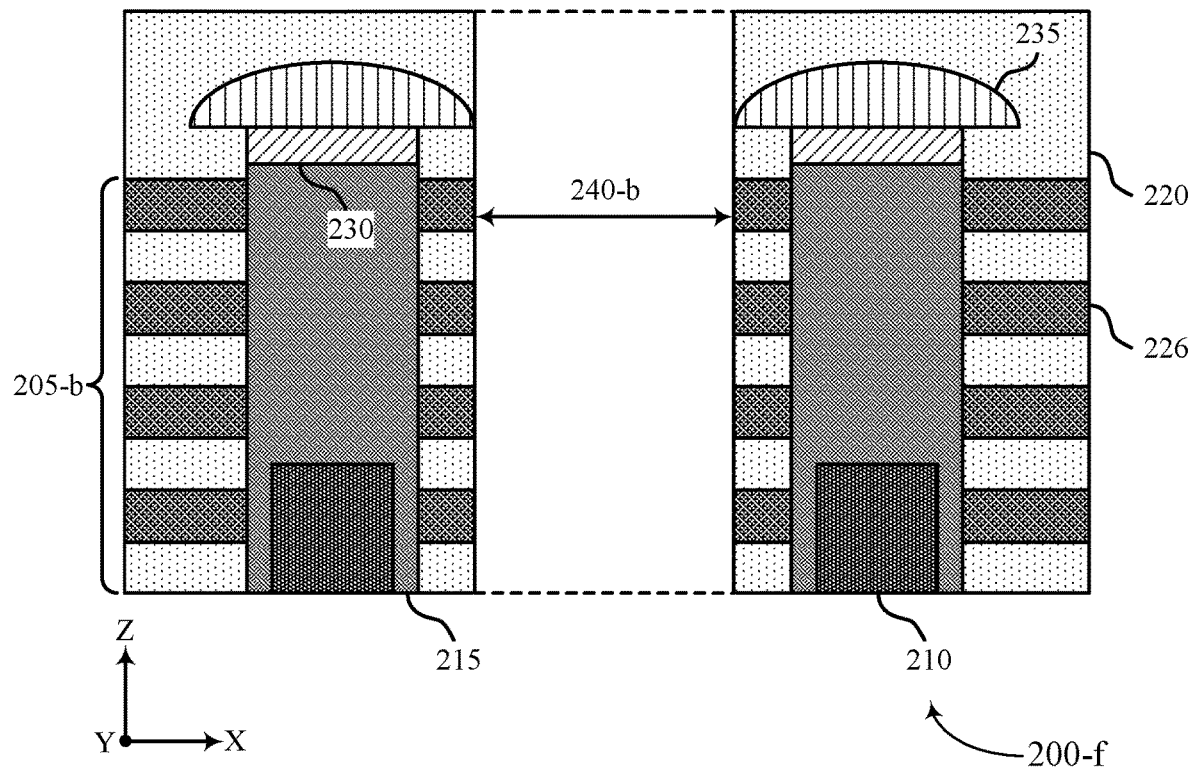

FIG. 2F illustrates the memory array after a processing step 200-f has been completed, where the processing step 200-f may include one or more steps or actions. In the processing step 200-f, the first portion of the stack of alternating materials 205-b may be removed to form a trench 240-b (e.g., which may be the same as or similar to trench 240-a). The first portion of the stack of alternating materials 205-b may be removed by an etching operation (e.g., a dry etch or a wet etch, among other etching techniques). In some cases, the masking material 235 may prevent the etching operation from removing the second portion of the memory array, where the second portion of the memory array may be located in the space below (e.g., underneath, directly below) the masking material 235 in the z-direction. In some cases, the second portion of the memory array may include a portion (e.g., second portion) of the stack of alternating materials 205-b, a portion of the polysilicon material 215, a portion of the pillar 210, or any combination thereof. The masking material 235 may prevent the second portion of the memory array from being removed by the etching operation due to the second width of the masking material 235 being greater than the first width of the polysilicon material 215 and pillar 210. The masking material 235 may act as a hardmask, where the etching operation may be unable to remove the masking material 235 and any material beneath or below the masking material 235 (e.g., in the z-direction). Thus, the second width of the masking material 235 may, in some cases, determine the width of the trench 240-b. For example, for a first pillar 210 and a second pillar 210, the corresponding masking materials 235 may create a space between the masking materials 235, where the space may be associated with the width of the trench 240-b (e.g., may be the width of the trench 240-b). The etching operation may remove materials for the width of the trench 240-b, for example, as determined by the space between the masking materials 235 of the first pillar 210 and the second pillar 210. As described herein, the etching operation may divide the memory cells of the memory array into subblocks.

Utilizing the masking material 235 may prevent the second portion of the memory array from being removed (e.g., incidentally, accidentally) during the etching operation at the processing step 200-f. Therefore, the masking material 235 may influence (e.g., dictate) the alignment of the etching operation at the processing step 200-f. For example, the masking material 235 may create a self-aligned trench that does not use photoalignment for the etching operation, but may still be centered between the pillars. In some cases, the masking material 235 may be used with photoalignment for the etching operation (e.g., may support photoalignment for the etching operation). For example, when using the photoalignment for the etching operation, the trench 240-b may or may not be centered between the pillars 210 due to misalignment (e.g., such as that caused by mechanical stress or bending described herein), but the masking material 235 may prevent the etching operation from removing (e.g., incidentally removing) the second portion of the memory array.

In some cases, the masking material 235 may have a width such that the masking materials 235 associated with different pillars may be in contact with each other in some location and not in contact in other locations, thereby preventing or limiting the space allocated for etching the trench 240-b. In some cases, another masking material (e.g., such as a hardmask, another hardmask) may be overlaid onto the masking material 235 (e.g., before the processing step 200-f, as part of the processing step 200-c). In some cases, the masking material 235 may be associated with preventing damage to the components of the memory array and preventing decreased functionality of the memory array, caused by the etching operation incidentally removing the second portion of the memory array (e.g., removing portions of the alternating stack of materials 205-b, the pillar(s) 210, and/or the polysilicon material(s) 215).

In some cases, after performing the processing step 200-f, a dielectric material may be deposited into the trench 240-b (e.g., filling the trench 240-b). The dielectric material may extend away from the substrate (e.g., along the z-direction) and through the stack of alternating materials 205-b, and may occupy the space formed by etching the trench 240-b. In some cases, after the dielectric material is deposited into the trench 240-b the masking material 235 may be removed (e.g., planarized). Upon removing the masking material 235, another material may be deposited onto the surface of the stack of alternating materials 205-b (e.g., to perform additional processing steps, to finish the memory array). In some cases, the first material 230 may experience intermixing with other materials contacting the first material 230, such as during processing steps 200-b and 200-c, among other examples. For example, the first material 230 may include intermixing with some masking material 235 (e.g., within a distance of a boundary with the masking material 235) and/or with some polysilicon material 215 (e.g., within a distance of a boundary with the polysilicon material 215). In some implementations, the first material 230 may contain a gradient of materials such that an amount of the masking material 235 may be found in the first material 230 towards the top of the first material 230 and an amount of the polysilicon material 215 may be found in the first material 230 towards the bottom of the first material 230 (e.g., in the z-direction).

Figure 3:
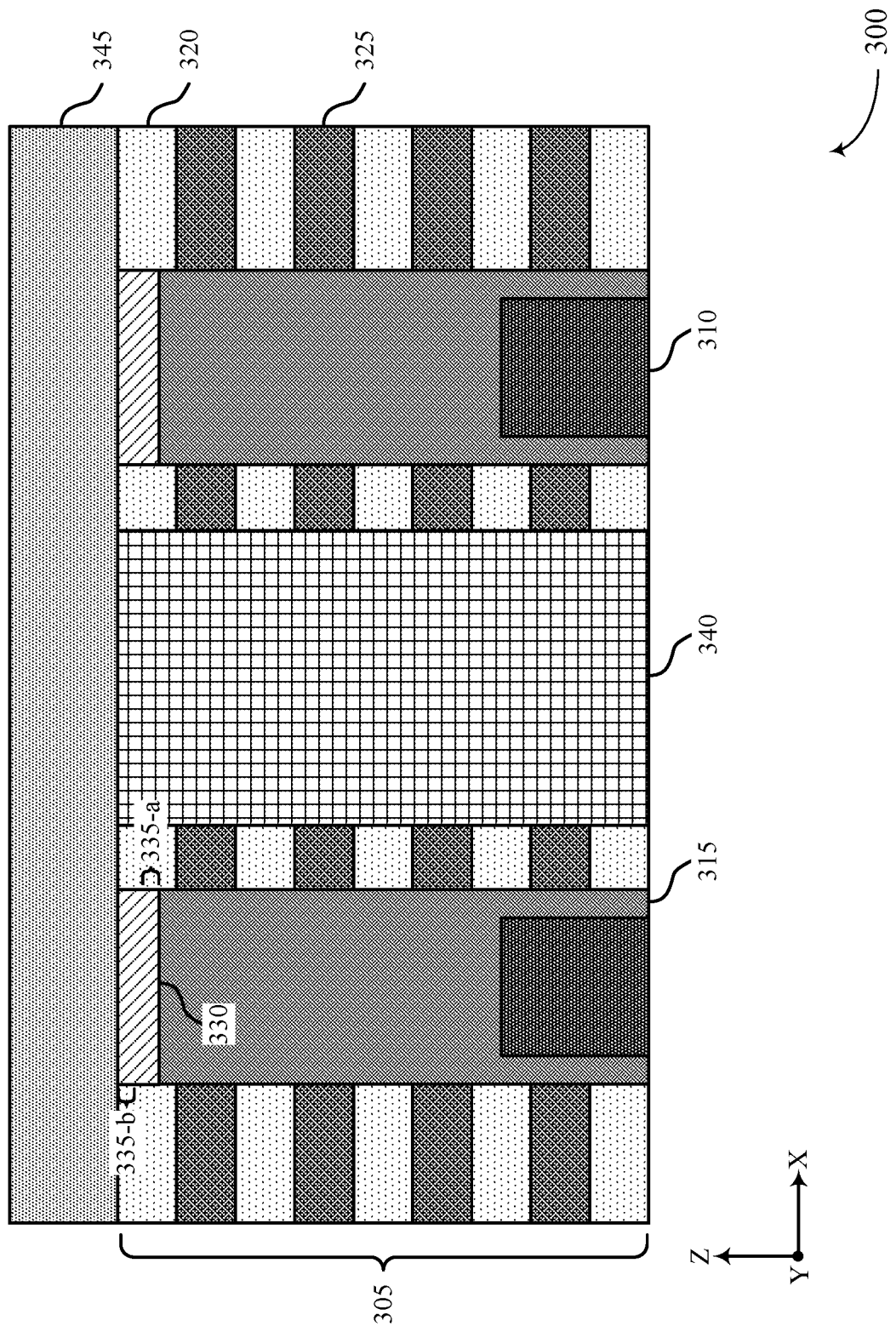
FIG. 3 illustrates an example of a memory architecture that supports self-aligned etching techniques for memory formation in accordance with examples as disclosed herein.

FIG. 3 illustrates an example of a memory architecture 300 that supports self-aligned etching techniques for memory formation in accordance with examples as disclosed herein. The memory architecture 300 may be an example for implementing aspects of a memory device 100 or processing steps 200 described with reference to FIGS. 1 and 2, respectively. For example, the memory architecture 300 may be an example of a memory array formed as described with reference to FIGS. 2A-2F. For illustrative purposes, aspects of the memory architecture 300 may be described with reference to an x-direction, a y-direction, and a z-direction of the illustrated coordinate system. For example, FIG. 3 illustrates a cross-sectional view of the memory architecture 300 in an xz-plane through the memory device. In some examples, the z-direction may be illustrative of a direction (e.g., a vertical direction, a layer direction) orthogonal to a surface of a substrate (e.g., a surface in an xy-plane, a surface upon or over which other materials may be deposited). Other cross-sections of the memory device (e.g., illustrated by their respective cross section in the xz-plane), may extend for some distance in the y-direction. Although the memory architecture 300 illustrates examples of relative dimensions and quantities of various features, aspects of the memory architecture 300 may be implemented with other relative dimensions or quantities of such features in accordance with examples as disclosed herein.

The memory architecture 300 may include a stack of alternating materials 305. The stack of alternating materials 305 may include alternating layers of an oxide material 320 (e.g., a dielectric material, an insulating material) and a conductive material 325. In some cases, the materials of the stack of alternating materials 305 may each be coplanar on an xy-plane to the substrate, extending in layers along the z-direction. The memory architecture may include one or more pillars 310 orthogonal to the stack of alternating materials 305 (e.g., extending along the z-direction). The pillars 310 may each include various materials such as a channel material, tunnel material, charge trapping material, and/or one or more oxide materials (e.g., among other examples). In combination with the stack of alternating materials 305, the pillar 310 may form a quantity of memory cells. For example, the conductive materials 325 may form word lines for the memory cells and various portions of a respective pillar 310 may form other portions of the memory cell as described herein.

The memory architecture may also include a polysilicon material 315 above the pillar 310 (e.g., in the z-direction), extending through the stack of alternating materials 305 (e.g., a portion of the stack of alternating materials 305, a top portion). The polysilicon material 315 may be associated with a selector gate of a transistor for a source or a drain of a channel (e.g., coupled to the polysilicon material 315), where the channel may be associated with the quantity of memory cells corresponding to the pillar 310.

Additionally, the memory architecture 300 may include a first material 330 above the polysilicon material 315, where the first material 330 and the polysilicon material 315 may have a similar width or a same width (e.g., the widths may be within a range of each other). The first material 330 may be located between (e.g., and contacting) the polysilicon material 315 and a second material 345, where the second material 345 may be above the stack of alternating materials 305 in the z-direction. The polysilicon material 315 may stop, and the first material 330 may begin, before a top of the stack of alternating materials 305 in the z-direction. As such, the first material 330 may be coupled with the stack of alternating materials 305 below a tope surface of the stack of alternating materials 305 (e.g., in the z-direction). In some cases, as illustrated, the first material 330 may have a top (e.g., in the z-direction) surface coplanar (e.g., largely or relatively coplanar) and colinear (e.g., largely or relatively colinear) to a top surface of the stack of alternating materials 305. Similarly, the second material 345 may have a bottom surface coplanar (e.g., largely or relatively coplanar) and colinear (e.g., largely or relatively colinear) to the top surface of the stack of alternating materials 305.

In some other cases, the top surface of the first material 330 may extend above the top surface of the stack of alternating materials 305, but may still contact or otherwise couple with the second material 345. In some implementations, the height (in the z-direction) of the top surface of the first material 330 may be determined by the presence of a planarization operation during manufacturing of the memory architecture 300, such as described with reference to FIGS. 2A-2F. For example, if a planarization operation is performed on the first material 330 during manufacturing, the resulting memory architecture 300 may include the first material 330 with the top surface coplanar to the top surface of the stack of alternating materials 305. In some cases, the first material 330 may be bonded or coupled with the polysilicon material 315, the stack of alternating materials 305, the second material 345, or any combination thereof. In some cases, a third material (e.g., a liner) may exist between the first material 330 and the polysilicon material 315 or between the first material 330 and the second material 345.

In some cases, the first material 330 may be a titanium nitride material and may be associated with the selector gate. In some examples, the first material 330 may be intermixed with other materials contacting or close to the first material 330. For example, the first material 330 may be intermixed with polysilicon material 315 (e.g., at least some polysilicon material 315) in a first portion 335-*a* of the first material 330 and may be intermixed with a masking material (e.g., at least some masking material) in a second portion 335-*b* of the first material 330. The masking material may be an oxide material (e.g., a tantalum oxide material), and may be associated with preventing an etch from removing a portion of the memory architecture 300, as described with reference to FIGS. 2A-2F.

In some cases, the masking material may be present at prior iterations of the memory architecture 300 (e.g., during manufacture or processing, as described with reference to FIGS. 2A-2F) but may be removed by a vapor etch or other operation. In some implementations, the first portion 335-*a* of the first material 330 may include a relatively higher amount of the polysilicon material 315 and the second portion 335-*b* of the first material 330 may include a relatively higher amount of the masking material. In some implementations, the first material 330 may contain a gradient of materials such that the masking material may be found towards the top (e.g., in the z-direction) of the first material 330 and the polysilicon material 315 may be found towards the bottom of the first material 330.

The memory architecture 300 may include multiple pillars 310, and the corresponding polysilicon material 315 and first material 330. For example, the memory architecture 300 may include any quantity of pillars 310, along with the corresponding polysilicon material 315 and first material 330. In some cases, the memory architecture may include a trench filled with a dielectric material 340. The dielectric material 340 may be positioned between a first pillar 310 and a second pillar 310 and may extend away from the substrate (e.g., along the z-direction) through the stack of alternating materials 305 and may separate the associated memory array into subblock (e.g., as described with reference to FIGS. 2A-2F).

Figure 4:
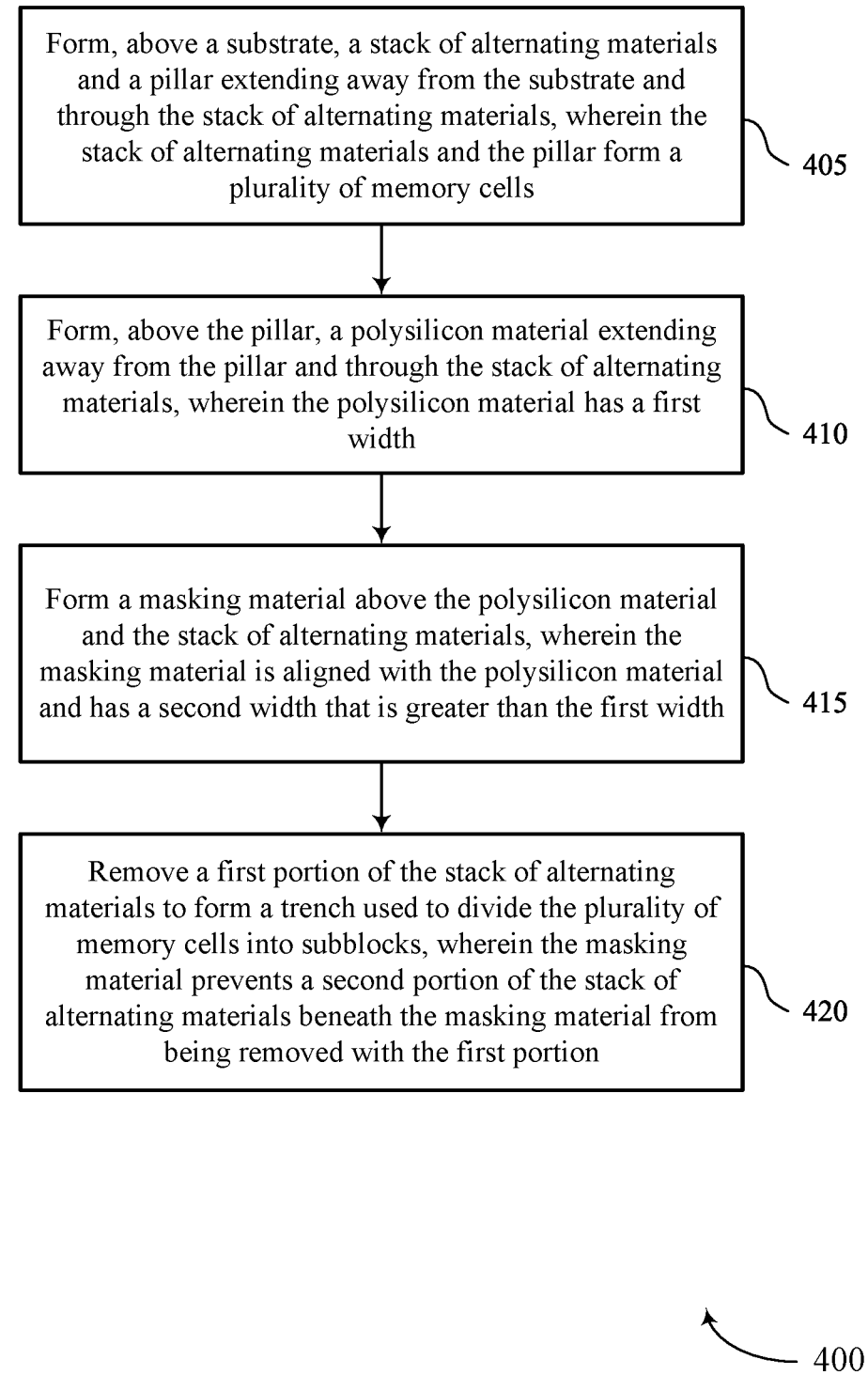
FIGS. 4 and 5 show flowcharts illustrating a method or methods that support self-aligned etching techniques for memory formation in accordance with examples as disclosed herein.

FIG. 4 shows a flowchart illustrating a method 400 that supports self-aligned etching techniques for memory formation in accordance with examples as disclosed herein. The operations of method 400 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 405, the method may include forming, above a substrate, a stack of alternating materials and a pillar extending away from the substrate and through the stack of alternating materials, where the stack of alternating materials and the pillar form a plurality of memory cells. The operations of 405 may be performed in accordance with examples as disclosed herein.

At 410, the method may include forming, above the pillar, a polysilicon material extending away from the pillar and through the stack of alternating materials, where the polysilicon material has a first width. The operations of 410 may be performed in accordance with examples as disclosed herein.

At 415, the method may include forming a masking material above the polysilicon material and the stack of alternating materials, where the masking material is aligned with the polysilicon material and has a second width that is greater than the first width. The operations of 415 may be performed in accordance with examples as disclosed herein.

At 420, the method may include removing a first portion of the stack of alternating materials to form a trench used to divide the plurality of memory cells into subblocks, where the masking material prevents a second portion of the stack of alternating materials beneath the masking material from being removed with the first portion. The operations of 420 may be performed in accordance with examples as disclosed herein.

In some examples, an apparatus (e.g., a manufacturing system) as described herein may perform a method or methods, such as the method 400. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for forming, above a substrate, a stack of alternating materials and a pillar extending away from the substrate and through the stack of alternating materials, where the stack of alternating materials and the pillar form a plurality of memory cells; forming, above the pillar, a polysilicon material extending away from the pillar and through the stack of alternating materials, where the polysilicon material has a first width; forming a masking material above the polysilicon material and the stack of alternating materials, where the masking material is aligned with the polysilicon material and has a second width that is greater than the first width; and removing a first portion of the stack of alternating materials to form a trench used to divide the plurality of memory cells into subblocks, where the masking material prevents a second portion of the stack of alternating materials beneath the masking material from being removed with the first portion.

Aspect 2: The method or apparatus of aspect 1, further including operations, features, circuitry, logic, means, or instructions, or any combination thereof for removing a portion of the polysilicon material that is opposite the substrate and expose a surface of the polysilicon material and depositing a first material above the surface of the polysilicon material based at least in part on removing the portion of the polysilicon material, where forming the masking material above the polysilicon material is based at least in part on depositing the first material.

Aspect 3: The method or apparatus of aspect 2 where forming the masking material includes operations, features, circuitry, logic, means, or instructions, or any combination thereof for performing a selective deposition process to bond the masking material to the first material.

Aspect 4: The method or apparatus of any of aspects 2 through 3 where the first material includes a titanium nitride material and the masking material includes a tantalum oxide material.

Aspect 5: The method or apparatus of any of aspects 1 through 4, further including operations, features, circuitry, logic, means, or instructions, or any combination thereof for removing one or more sacrificial materials from the stack of alternating materials and forming one or more conductive materials in the stack of alternating materials to form the plurality of memory cells based at least in part on removing the one or more sacrificial materials, where removing the first portion of the stack of alternating materials to form the trench is based at least in part on forming the one or more conductive materials.

Aspect 6: The method or apparatus of any of aspects 1 through 5, further including operations, features, circuitry, logic, means, or instructions, or any combination thereof for forming, in the trench, a dielectric material extending away from the substrate and through the stack of alternating materials based at least in part on removing the first portion of the stack of alternating materials.

Aspect 7: The method or apparatus of any of aspects 1 through 6 where the polysilicon material is associated with a selector gate for the plurality of memory cells.

Aspect 8: The method or apparatus of any of aspects 1 through 7 where the masking material includes a tantalum oxide material.

Figure 5:
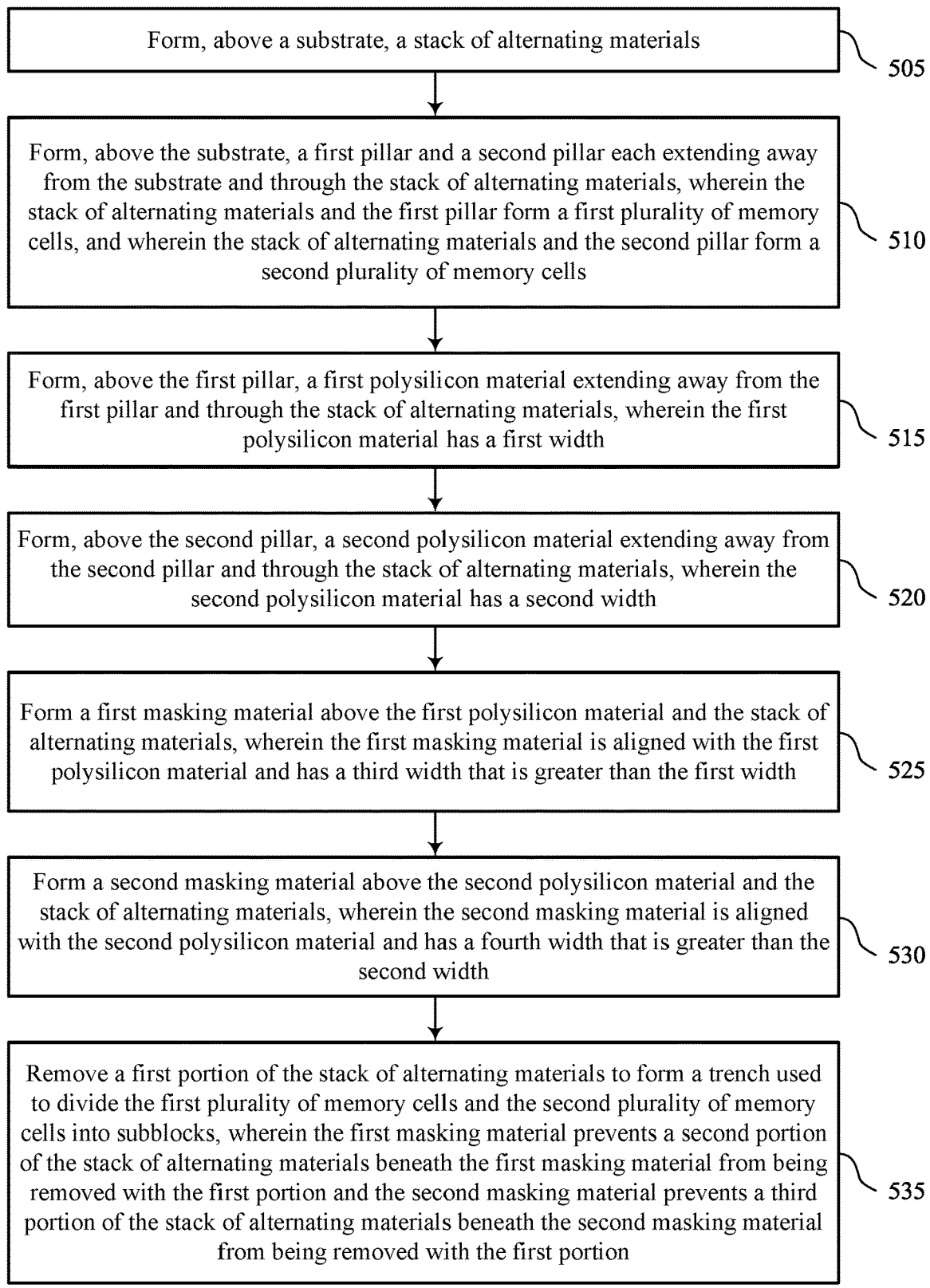

FIG. 5 shows a flowchart illustrating a method 500 that supports self-aligned etching techniques for memory formation in accordance with examples as disclosed herein. The operations of method 400 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 505, the method may include forming, above a substrate, a stack of alternating materials. The operations of 505 may be performed in accordance with examples as disclosed herein.

At 510, the method may include forming, above the substrate, a first pillar and a second pillar each extending away from the substrate and through the stack of alternating materials, where the stack of alternating materials and the first pillar form a first plurality of memory cells, and where the stack of alternating materials and the second pillar form a second plurality of memory cells. The operations of 510 may be performed in accordance with examples as disclosed herein.

At 515, the method may include forming, above the first pillar, a first polysilicon material extending away from the first pillar and through the stack of alternating materials, where the first polysilicon material has a first width. The operations of 515 may be performed in accordance with examples as disclosed herein.

At 520, the method may include forming, above the second pillar, a second polysilicon material extending away from the second pillar and through the stack of alternating materials, where the second polysilicon material has a second width. The operations of 520 may be performed in accordance with examples as disclosed herein. I At 525, the method may include forming a first masking material above the first polysilicon material and the stack of alternating materials, where the first masking material is aligned with the first polysilicon material and has a third width that is greater than the first width. The operations of 525 may be performed in accordance with examples as disclosed herein.

At 530, the method may include forming a second masking material above the second polysilicon material and the stack of alternating materials, where the second masking material is aligned with the second polysilicon material and has a fourth width that is greater than the second width. The operations of 530 may be performed in accordance with examples as disclosed herein.

At 535, the method may include removing a first portion of the stack of alternating materials to form a trench used to divide the first plurality of memory cells and the second plurality of memory cells into subblocks, where the first masking material prevents a second portion of the stack of alternating materials beneath the first masking material from being removed with the first portion and the second masking material prevents a third portion of the stack of alternating materials beneath the second masking material from being removed with the first portion. The operations of 535 may be performed in accordance with examples as disclosed herein.

In some examples, an apparatus (e.g., a manufacturing system) as described herein may perform a method or methods, such as the method 500. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 9: A method or apparatus including operations, features, circuitry, logic, means, or instructions, or any combination thereof for forming, above a substrate, a stack of alternating materials; forming, above the substrate, a first pillar and a second pillar each extending away from the substrate and through the stack of alternating materials, where the stack of alternating materials and the first pillar form a first plurality of memory cells, and where the stack of alternating materials and the second pillar form a second plurality of memory cells; forming, above the first pillar, a first polysilicon material extending away from the first pillar and through the stack of alternating materials, where the first polysilicon material has a first width; forming, above the second pillar, a second polysilicon material extending away from the second pillar and through the stack of alternating materials, where the second polysilicon material has a second width; forming a first masking material above the first polysilicon material and the stack of alternating materials, where the first masking material is aligned with the first polysilicon material and has a third width that is greater than the first width; forming a second masking material above the second polysilicon material and the stack of alternating materials, where the second masking material is aligned with the second polysilicon material and has a fourth width that is greater than the second width; and removing a first portion of the stack of alternating materials to form a trench used to divide the first plurality of memory cells and the second plurality of memory cells into subblocks, where the first masking material prevents a second portion of the stack of alternating materials beneath the first masking material from being removed with the first portion and the second masking material prevents a third portion of the stack of alternating materials beneath the second masking material from being removed with the first portion.

Aspect 10: The method or apparatus of aspect 9, further including operations, features, circuitry, logic, means, or instructions, or any combination thereof for removing a portion of the first polysilicon material that is opposite the substrate and expose a first surface of the first polysilicon material; removing a portion of the second polysilicon material that is opposite the substrate and expose a second surface of the second polysilicon material; depositing a first material above the first surface of the first polysilicon material based at least in part on removing the portion of the first polysilicon material, where forming the first masking material on the first polysilicon material is based at least in part on depositing the first material; and depositing a second material above the second surface of the second polysilicon material based at least in part on removing the portion of the second polysilicon material, where forming the second masking material above the second polysilicon material is based at least in part on depositing the second material.

Aspect 11: The method or apparatus of aspect 10 where forming the first masking material and the second masking material, further includes operations, features, circuitry, logic, means, or instructions, or any combination thereof for performing a selective deposition process to bond the first masking material to the first material and the second masking material to the second material.

Aspect 12: The method or apparatus of any of aspects 9 through 11 where the trench has a fifth width that is based at least in part on a distance between the first masking material and the second masking material.

Aspect 13: The method or apparatus of any of aspects 9 through 12 where the first polysilicon material is associated with a first selector gate for the first plurality of memory cells and the second polysilicon material is associated with a second selector gate for the second plurality of memory cells.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 14: An apparatus, including: a substrate; a stack of alternating materials positioned above the substrate, the stack of alternating materials including dielectric materials and conductive materials, the conductive materials each including a respective word line for a memory cell of a plurality of memory cells associated with the stack of alternating materials; a pillar positioned above the substrate and extending through the stack of alternating materials, where the stack of alternating materials and the pillar form the plurality of memory cells; a polysilicon material above the pillar and associated with a selector gate for the plurality of memory cells, the polysilicon material extending away from the pillar and through the stack of alternating materials, where the polysilicon material terminates before a top surface of the stack of alternating materials that is opposite the substrate; and a nitride material above the polysilicon material and coupled with the stack of alternating materials below the top surface of the stack of alternating materials, the nitride material aligned with the polysilicon material.

Aspect 15: The apparatus of aspect 14, further including: a second pillar positioned above the substrate and extending through the stack of alternating materials, where the stack of alternating materials and the second pillar form a second plurality of memory cells; a second polysilicon material above the second pillar and associated with a second selector gate for the second plurality of memory cells, the second polysilicon material extending away from the second pillar and through the stack of alternating materials, where the second polysilicon material terminates before the top surface of the stack of alternating materials that is opposite the substrate; and a second nitride material above the second polysilicon material and coupled with the stack of alternating materials below the top surface of the stack of alternating materials, the second nitride material aligned with the second polysilicon material.

Aspect 16: The apparatus of aspect 15, further including: a dielectric material positioned between the pillar and the second pillar, the dielectric material extending away from the substrate and through the stack of alternating materials.

Aspect 17: The apparatus of any of aspects 14 through 16, where the nitride material includes: a first region of nitride material mixed with polysilicon material, where the first region is located within a first distance of a bottom surface of the nitride material.

Aspect 18: The apparatus of any of aspects 14 through 17, where the nitride material includes: a second region of nitride material mixed with oxide material, where the second region is located within a second distance of a top surface of the nitride material that is opposite the substrate.

Aspect 19: The apparatus of aspect 18, where the oxide material includes a tantalum oxide material.

Aspect 20: The apparatus of any of aspects 14 through 19, where the nitride material includes a titanium nitride material.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a substrate;
   a stack of alternating materials positioned above the substrate, the stack of alternating materials comprising dielectric materials and conductive materials, the conductive materials each comprising a word line for a memory cell of a plurality of memory cells associated with the stack of alternating materials;
   a pillar positioned above the substrate and extending through the stack of alternating materials, wherein the stack of alternating materials and the pillar form the plurality of memory cells;
   a polysilicon material above the pillar and associated with a selector gate for the plurality of memory cells, the polysilicon material extending away from the pillar and through the stack of alternating materials, wherein the polysilicon material terminates before a top surface of the stack of alternating materials that is opposite the substrate; and
   a nitride material above the polysilicon material and coupled with the stack of alternating materials below the top surface of the stack of alternating materials, the nitride material aligned with the polysilicon material.

2. The apparatus of claim 1, further comprising:
   a second pillar positioned above the substrate and extending through the stack of alternating materials, wherein the stack of alternating materials and the second pillar form a second plurality of memory cells;
   a second polysilicon material above the second pillar and associated with a second selector gate for the second plurality of memory cells, the second polysilicon material extending away from the second pillar and through the stack of alternating materials, wherein the second polysilicon material terminates before the top surface of the stack of alternating materials that is opposite the substrate; and
   a second nitride material above the second polysilicon material and coupled with the stack of alternating materials below the top surface of the stack of alternating materials, the second nitride material aligned with the second polysilicon material.

3. The apparatus of claim 2, further comprising:
   a dielectric material positioned between the pillar and the second pillar, the dielectric material extending away from the substrate and through the stack of alternating materials.

4. The apparatus of claim 1, wherein the nitride material comprises:
   a first region of the nitride material mixed with the polysilicon material, wherein the first region is located within a first distance of a bottom surface of the nitride material.

5. The apparatus of claim 1, wherein the nitride material comprises:
   a second region of the nitride material mixed with an oxide material, wherein the second region is located within a second distance of a top surface of the nitride material that is opposite the substrate.

6. The apparatus of claim 5, wherein the oxide material comprises a tantalum oxide material.

7. The apparatus of claim 1, wherein the nitride material comprises a titanium nitride material.

* * * * *